United States Patent [19]

Iida et al.

[11] Patent Number: 5,501,780
[45] Date of Patent: Mar. 26, 1996

[54] HEAT INSULATING GLASS WITH MULTILAYER COATING

[75] Inventors: Yasunchu Iida; Satoru Honda, both of Matsusaka; Sachio Asai, Taki; Isao Nakamura, Fujisato; Hidenori Noguchi, Matsusaka; Takao Tomioka, Kawa, all of Japan

[73] Assignee: Central Glass Company, Limited, Ube City, Japan

[21] Appl. No.: 105,581

[22] Filed: Aug. 13, 1993

[30] Foreign Application Priority Data

Aug. 13, 1992 [JP] Japan .................................. 4-215989

[51] Int. Cl.⁶ .................................................. C23C 14/00
[52] U.S. Cl. .................. 204/192.15; 204/192.22; 204/192.26; 204/192.27; 204/192.28
[58] Field of Search .......................... 204/192.15, 192.26, 204/192.27, 192.28, 192.22

[56] References Cited

U.S. PATENT DOCUMENTS

| | | | |
|---|---|---|---|
| 4,048,039 | 9/1977 | Daxinger | 204/192.28 |
| 4,101,200 | 7/1978 | Daxinger | 204/192.26 |
| 4,786,784 | 11/1988 | Nikoderm | 204/192.26 |
| 4,911,809 | 3/1990 | Wort | 204/192.26 |
| 4,946,751 | 8/1990 | Bruns | 204/192.28 |

FOREIGN PATENT DOCUMENTS

| | | |
|---|---|---|
| 2-57954 | 10/1963 | Japan . |
| 60-36355 | 2/1985 | Japan . |
| 3-208837 | 9/1991 | Japan . |
| 3-252332 | 11/1991 | Japan . |
| 4-110611 | 9/1992 | Japan . |
| 5-35849 | 5/1993 | Japan . |

Primary Examiner—Ellis P. Robinson
Assistant Examiner—Timothy M. Speer
Attorney, Agent, or Firm—Keck, Mahin & Cate

[57] ABSTRACT

A gray-colored heat insulating glass plate has a transparent glass plate and a multilayer coating formed on one side of the glass plate. The multilayer coating includes first, second and third layers. The first layer is formed on a surface of the glass plate, is a film of a tantalum oxide, and has a thickness ranging from 5 to 20 nm. The second layer is formed on the first layer, is a film of an oxynitride of a metal selected from Cr, Ni—Cr alloy and stainless steel, and has a thickness ranging from 5 to 25 nm. The third layer is formed on the second layer, is a film of a tantalum oxide, and has a thickness ranging from 5 to 20 nm. The heat insulating glass plate is sufficiently low in transmittance for solar radiation, sufficiently high in transmittance for radio waves, relatively low in transmittance for the visible light and good in durability.

18 Claims, 3 Drawing Sheets

HEAT INSULATING GLASS WITH MULTILAYER COATING

BACKGROUND OF THE INVENTION

1. Field of the Invention

The present invention relates to a heat insulating glass plate for use in buildings or vehicles, and more particularly to a glass plate with a heat insulating multilayer coating, which has a gray color and is fairly low in transmittance for solar radiation and fairly high in transmittance for radio waves.

2. Description of the Prior Art

Hitherto, various heat insulating multilayer coatings have been proposed to be formed on a transparent glass plate. For example, JP-A-60-36355 discloses a heat reflecting three-layer coating consisting of a first layer of an oxide of a metal selected from Sn, Ti and Al, a second layer of chromium nitride, and a third layer of a dielectric material. The first layer has an optical thickness ranging from 20 to 280 nm. The second layer has a geometrical thickness ranging from 10 to 40 nm. The coated glass plate has a transmittance ranging from 5 to 40% for the visible light. Color of light reflected from the uncoated side of the glass plate is adjusted by the optical thickness of the first layer.

JP-A-3-208837 discloses a heat insulating four-layer coating consisting of a first layer of SiOx or Al.SiOx, a second layer of TiNx, a third layer of TiOx, and a fourth layer of SiOx or Al.SiOx. The four-layer coating is formed on a transparent glass plate by the sputtering method. The first to fourth layers have thicknesses of 10–30 nm, 10–40 nm, 0–20 nm and 30–50 nm, respectively. Light reflected from the uncoated side of the glass plate has a bluish color.

JP-A-3-252332 discloses a heat reflecting three-layer coating with low reflectance for radio waves, which is formed on a transparent glass plate. The three-layer coating consists of first and third layers of colored dielectric films having a surface resistivity not lower than $10^4$ M$\Omega/\square$ and a second layer interposed between the first and third layers. The second layer is a metal film or a metal nitride film, and has a surface resistivity not lower than 200 $\Omega/\square$. Light reflected from the uncoated side of the glass plate has a blue color or a golden color. However, in view of recent strict demand for low reflectance for radio waves, reflectance of the three-layer coating for radio waves is still unsatisfactory.

Recently, a so-called shade band has been proposed to be formed on an upper end portion of a front windshield of an automobile for the purpose of lowering glare of the sunshine. The shade band of the front windshield is usually prepared by incorporating a colorant into an interlayer (polyvinyl butyral film) of a laminated glass plate. For example, it is desired to have a shade band having a gray color which is in harmony with the color of automobile interior and the color of automobile windshields. However, the above-mentioned three publications disclose multilayer coatings which provide the glass plates with colors other than gray color.

SUMMARY OF THE INVENTION

It is therefore an object of the present invention to provide a gray-colored heat insulating glass plate with a multilayer coating, which is sufficiently low in transmittance for solar radiation, sufficiently high in transmittance for radio waves, relatively low in transmittance for the visible light and good in durability.

It is another object of the present invention to provide an improved method for forming a thin film band having a gradated portion on each of a plurality of transparent glass plates by means of jigs.

According to a first aspect of the present invention, there is provided a gray-colored heat insulating glass plate having a transparent glass plate and a multilayer coating formed on one side of the glass plate, the multilayer coating comprising:

a first layer formed on a surface of the glass plate, said first layer being a film of a tantalum oxide and having a thickness ranging from 5 to 20 nm;

a second layer formed on said first layer, said second layer being a film of an oxynitride of a metal selected from Cr, Ni—Cr alloy and stainless steel and having a thickness ranging from 5 to 25 nm; and a third layer formed on said second layer, said third layer being a film of a tantalum oxide and having a thickness ranging from 5 to 20 nm.

According to a second aspect of the present invention, there is provided a method for forming thin film bands on first and second transparent glass plates by means of first and second jigs, each of the first and second jigs being formed with a projection portion, the method comprising the steps of:

(a) placing the first glass plate on a base member such that a first major surface of the first glass plate is exposed, the first major surface having a first end portion and a first adjacent portion which bounds on the first end portion;

(b) placing the first jig on the first glass plate so as to precisely position the first jig relative to the first glass plate such that a major portion of the first major surface is masked by the first jig, such that the first end portion of the first glass plate remains exposed and such that the projection portion of the first jig is positioned above the first adjacent portion;

(c) placing the second glass on the first jig so as to precisely position the second glass plate relative to the first jig such that a second major surface of the second glass plate is exposed, the second major surface having a second end portion and a second adjacent portion which bounds on the second end portion, and such that the first end portion of the first glass plate still remains exposed;

(d) placing the second jig on the second glass plate so as to precisely position the second jig relative to the second glass plate and to form a structure having the first and second glass plates and the first and second jigs such that a major portion of the second major surface is masked by the second jig, such that the first and second end portions remain exposed and such that the projection portion of the second jig is positioned above the second adjacent portion;

(e) placing the structure in a physical vapor deposition device such that the first and second end portions are exposed to a target of the device; and (f) actuating the device such that a first thin film portion deposits on each of the first and second end portions and a second thin film portion deposits on each of the first and second adjacent portions, the first and second thin film portions being merged with each other so as to form the thin film band, the first thin film portion being uniform in thickness and color, the second thin film portion being wedge like in shape and thus gradated in color.

According to a third aspect of the present invention, there is provided a jig for positioning and masking a glass plate, the glass plate having a major surface having an end portion and an adjacent portion bounding on the end portion, said jig being sized so as to mask a major part of the major surface when said jig is placed on the glass plate, said jig comprising:

a projection portion which is to be positioned above the adjacent portion when the jig is placed on the glass plate;

means for adjusting a projected length of the projection portion; and means for adjusting a height of the projection portion, the height being defined as a distance between the projection portion and the glass plate when the jig is placed on the glass plate.

DESCRIPTION OF THE PREFERRED EMBODIMENTS

A heat insulating multilayer coating according to the present invention will be described in the following.

The multilayer coating is made up of a first layer formed directly on one surface of a transparent glass plate, a second layer which is laid on the first layer, and a third layer which is laid on the second layer. The first layer is a film of a tantalum oxide (TaOx) and has a thickness ranging from 5 to 20 nm. The second layer is a film of an oxynitride of stainless steel (SUSNOx) and has a thickness ranging from 5 to 25 nm. The third layer is a film of TaOx and has a thickness ranging from 5 to 20 nm. The multilayer coating is formed on the glass plate by the sputtering method.

Due to the use of the TaOx film having a thickness ranging from 5 to 20 nm as the first layer, adhesion of the SUSNOx film to the glass plate is substantially improved. The thickness of the first layer is preferably from about 5 to about 15 nm, and more preferably from about 5 to about 10 nm. If the first layer is too thick in thickness, interference color is produced by the optical interference of the multilayer coating. With this, the color tone changes according to the angle of view.

Due to the use of the SUSNOx film having a thickness ranging from 5 to 25 nm as the second layer, the multilayer coating has a gray color and becomes superior in durability. Therefore, the glass plate with the gray-colored multilayer coating matches with, for example, the automobile interior, suppresses glare of the sunshine, and improves the habitability. The multilayer coating is particularly suitable to be used as a shade band of an automobile. Furthermore, due to the use of the SUSNOx film as the second layer, the multilayer coating has a surface resistivity not lower than 1 k$\Omega$/□. That is, the multilayer coating is high in electrical resistance, and hence it transmits radio waves without great attenuation. The radio wave transmittance of the heat insulating glass plate is almost comparable to that of the uncoated glass plate. Therefore, the heat insulating glass plate is suitable to be used in high-rise buildings. With this, ghost phenomenon of TV sets of the nearby houses can be minimized. Still furthermore, due to the use of the SUSNOx film as the second layer, the multilayer coating becomes superior in wear resistance, durability, chemical resistance, and the like. The thickness of the second layer is preferably from about 6 to about 23 nm, and more preferably from about 8 to about 20 nm. With this, visible light transmittance is suitably lowered, thereby lowering glare of the sunshine. If a film of stainless steel is used as the second layer instead of the SUSNOx film, the second layer will usually provide a silver or golden color due to a high reflectance, for example, not lower than about 20%. Only in the case that the stainless steel film has a thickness not more than about 10 nm, it will provide a gray color. Furthermore, the stainless steel film has a surface resistivity not higher than 1 k$\Omega$/□ even if the visible light transmittance is adjusted to about 60%. This value of surface resistivity is insufficient in terms of radio wave transmittance. If a film of a nitride of stainless steel is used as the second layer instead of the SUSNOx film, the second layer will provide a gray color. The stainless steel nitride film will have a surface resistivity which is higher than that of the stainless steel film but is still not higher than 1 k$\Omega$/□. If a film of CrN, SiC or the like is used as the second layer, the second layer becomes satisfactory in visible light transmittance, surface resistivity, durability and the like. However, the second layer will not provide a gray color, but a bronze or golden color.

Instead of the SUSNOx film, it is optional to use a film of an oxynitride of either Cr or Ni—Cr alloy (nichrome) as the second layer. The surface resistivity of the second layer increases by increasing the oxygen content of the oxynitride. With this, the color tone of the second layer turns gradually from a gray color to a bronze color, and the mechanical strength of the second layer tends to increase. According to the present invention, the oxygen content of the oxynitride is preferably not higher than 30%.

Due to the use of the TaOx film having a thickness ranging from 5 to 20 nm as the third layer (the outermost layer), durability of the multilayer coating is improved. Stains such as fingerprints can be easily removed from the multilayer coating because the TaOx film as the third layer has a very smooth surface. The thickness of the TaOx film is preferably from about 5 to about 15 nm, and more preferably from about 5 to about 10 nm.

The multilayer coating is formed such that the heat insulating glass plate has a transmittance ranging from 10% to 60% for the visible light. The transmittance for the visible light can be arbitrarily adjusted within this range. If it is lower than 10%, visible light reflectance of the uncoated side of the glass plate becomes higher than about 25%. Therefore, the color tone of the glass plate turns into a silver or golden color. The visible light reflectance of the uncoated side of the glass plate is preferably not higher than 18%, and more preferably not higher than 15%. If the transmittance for the visible light is more than 60%, glare of the sunshine can not be sufficiently suppressed and the heat insulating capability of the glass plate becomes unsatisfactory. The transmittance for the visible light is preferably from about 20 to about 55%, and more preferably from about 30 to about 50%.

In the present invention, the transparent glass plate is either a colorless glass plate or a colored glass plate as long as the coated glass plate has a gray color tone. The glass is not necessarily an inorganic glass and may be a so-called organic or plastic glass. The glass plate is not necessarily used as a single plate, and may be used as a component of a laminated glass or an insulated glass.

The following nonlimitative examples are illustrative of the present invention.

EXAMPLE 1

A three-layer coating according to the present invention was formed on an about 300 mm square and about 3.1 mm thick plate of a gray glass (NG 3.1). The glass plate was washed with a neutral detergent, rinsed with water and further with isopropyl alcohol and dried. Then, the glass plate was set horizontally on a carrier which was horizontally movably installed in a vacuum chamber of a DC magnetron reactive sputtering apparatus. The carrier reciprocatively movable so as to be positioned alternately above a stainless steel target and a Ta target. Initially the chamber was depressurized to the extent of about $5\times10^{-6}$ Torr. Then, a mixed gas of $O_2$ and Ar was introduced into the vacuum chamber to maintain the degree of vacuum at about $2\times10^{-3}$ Torr. Flow rate ratio of $O_2$ to Ar was adjusted to 100:0 to 50:50. Under such condition, the Ta target was sputtered at a power of about 2.0 kW while the glass plate was horizontally transferred in a region above the Ta target at a constant speed of about 250 mm/min. As the result, a TaOx film having a thickness of about 10 nm deposited on the glass plate as the first layer.

Then, the feed of the gas and the power supply to the Ta target were stopped, and about 68 cc of $N_2$ gas and about 2 cc of $O_2$ gas were introduced into the vacuum chamber to maintain the degree of vacuum at about $2\times10^{-3}$ Torr. The flow rate ratio of $N_2$ to $O_2$ was adjusted to 99:1 to 90:10. Under such condition, the glass plate was transferred to a region above the stainless steel target, and the stainless steel target was sputtered at a power of about 0.5 kW while the glass plate was horizontally transferred at a constant speed of about 900 mm/min. As the result, a SUSNOx film having a thickness of about 5 nm deposited, as the second layer, on the first layer.

Then, the feed of gas and the power supply to the stainless steel target were stopped, and $O_2$ gas and Ar gas were introduced into the vacuum chamber to have a flow rate ratio of $O_2$ gas to Ar gas in a range from 100:0 to 50:50 and to maintain the degree of vacuum at about $2\times10^{-3}$ Torr. Under such condition, the glass plate was carried back to the region above the Ta target, and the Ta target was sputtered at a power of about 2.0 kW while the glass plate was horizontally transferred at a constant speed of about 250 mm/min. As the result, a TaOx film having a thickness of about 10 nm deposited, as the third layer, on the second layer. Then, the feed of the gas and the power supply to the Ta target were stopped.

By the above process a three-layer coating was formed on one side of the glass plate. The coated glass plate had a gray color. Several samples were produced by the same process and under the same conditions.

On the samples of the coated glass plate the transmittance and reflectance for the visible light (380–780 nm) and transmittance for solar radiation (340–1800 nm) were measured with an automatic recording spectrophotometer (Type 340 of Hitachi Ltd.) by the methods according to JIS Z 8722 and JIS R 3106. The results are shown in Table 2.

Besides, wear resistance of the multilayer coating was examined by the Taber test. The test was made on 10 cm square specimens of the coated glass plate with a Taber's abrasion tester (MODEL 503 of TYBER Co.) using two abrading wheels of CS-10F type. A load of 500 g was applied to each abrading wheel, and the test was continued until 1000 turns of the abrading wheels on the surface of the multilayer coating. Before and after the Taber test the haze value of each specimen was measured with a haze meter (NDH-20D of Nippon Denshoku Kogyo Co.) to find a difference between the two measurements, $\Delta H$. The result is shown in Table 2.

Further, acid and alkali resistances of the multilayer coating were examined by immersing some specimens of the coated glass plate in 1N HCl solution at room temperature for about 6 hr and separate specimens in 1N NaOH solution at room temperature for about 6 hr. In both cases the degree of deterioration of the coating was examined by visual observation. On every specimen, deterioration of the coating was hardly perceptible according to JIS R 3221.

The surface resistivity of the coating was measured with a tester of the four-probe type (RT-8 of NAPSON Co.) for a specimen having a surface resistivity not higher than $10^5$ $\Omega/\square$ or with a high surface resistivity tester (HIRESTA HT-210 of Mitsubishi Yuka Co.) for a specimen having a surface resistivity from $10^5$ $\Omega/\square$ to $10^5$M $\Omega/\square$. The result is shown in Table 2.

EXAMPLES 2–5

As shown in Table 1, in these examples, the multilayer coating of Example 1 was modified in respect of the thickness of each layer. For this purpose, the sputtering method of Example 1 was modified only in respect of the transfer speed of the glass plate during the sputtering. That is, for obtaining each of the first and third layers, the transfer speeds were respectively about 500 mm/min (Example 2), about 177 mm/min (Example 3), about 250 mm/min (Example 4) and about 125 mm/min (Example 5). For obtaining the second layer, the transfer speeds were respectively about 180 mm/min (Example 2), about 563 mm/min (Example 3), about 375 mm/min (Example 4), and about 300 mm/min (Example 5).

The optical characteristics (the transmittance and reflectance for the visible light, transmittance for solar radiation, and the color of the coated glass plate) of the heat insulating glass plates of Examples 2–5 are shown in Table 2. The surface resistivity of the multilayer coatings of Examples 2–5 and the result of the Taber test on the same are also shown in Table 2. The multilayer coatings of Examples 2–5 were subjected to the acid and alkali tests described hereinbefore. By these tests, the coating of every example exhibited little deterioration.

COMPARATIVE EXAMPLE 1

In Comparative Example 1, a stainless steel (SUS) film was formed as the second layer instead of the SUSNOx films of Examples 1–5.

Similar to Example 1, a TaOx film having a thickness of 5 nm was formed on a glass plate by the sputtering method with a transfer speed of about 500 mm/min. Then, a SUS target was sputtered at a power of about 0.2 kW under an Ar gas pressure of about $2 \times 10^{-3}$ Torr while the glass plate was horizontally transferred at a constant speed of about 1150 mm/min. As the result, the SUS film having a thickness of about 10 nm deposited on the first layer. Then, similar to Example 1, a TaOx film having a thickness of 5 nm was formed on the second layer by the sputtering method with a transfer speed of about 500 mm/min.

COMPARATIVE EXAMPLES 2–4

In Comparative Examples 2–4, a stainless steel nitride (SUSNx) film was formed as the second layer instead of the SUSNOx films of Examples 1–5.

Similar to Example 1, for forming the first and third layers, TaOx films having thicknesses of about 5 nm (Comparative Example 3) and about 10 nm (Comparative Examples 2 and 4) were formed on glass plates by the sputtering method with transfer speeds of about 500 mm/min (Comparative Example 3) and about 250 mm/min (Comparative Examples 2 and 4), respectively. For forming the second layers, a SUS target was sputtered at a power of about 0.5 kW under a $N_2$ gas pressure of about $2 \times 10^{-3}$ Torr while the glass plates were horizontally transferred at constant speeds of about 345 mm/min (Comparative Example 2), about 415 mm/min (Comparative Example 3), and about 138 mm/min (Comparative Example 4), respectively. As the result, the SUSNx films having thicknesses of about 12 nm (Comparative Example 2), about 10 nm (Comparative Example 3) and about 30 nm (Comparative Example 4) deposited on the first layers, respectively.

COMPARATIVE EXAMPLE 5

In Comparative Example 5, a chromium nitride (CrNx) film was formed as the second layer instead of the SUSNOx films of Examples 1–5.

Similar to Example 1, for forming the first and third layers, TaOx films having a thickness of about 10 nm were formed on a glass plate by the sputtering method with a transfer speed of about 250 mm/min, respectively. For forming the second layer, a Cr target was sputtered at a power of about 0.4 kW under a $N_2$ gas pressure of about $2 \times 10^{-3}$ Torr while the glass plate was horizontally transferred at a constant speed of about 200 mm/min. As the result, the CrNx film having a thickness of about 15 nm deposited on the first layer.

COMPARATIVE EXAMPLE 6

In Comparative Example 6, a SiC film was formed as the second layer instead of the SUSNOx films of Examples 1–5.

Similar to Example 1, for forming the first and third layers, TaOx films having a thickness of about 10 nm were formed on a glass plate by the sputtering method with a transfer speed of about 250 mm/min, respectively. For forming the second layer, a SiC target was sputtered at a power of about 1.0 kW under an Ar gas pressure of about $2 \times 10^{-3}$ Torr while the glass plate was horizontally transferred at a constant speed of about 480 mm/min. As the result, the SiC film having a thickness of about 20 nm deposited on the first layer.

The optical characteristics of the heat insulating glass plates of Comparative Examples 1–6 are shown in Table 2. The surface resistivity of the multilayer coatings of Comparative Examples 1–6 and the result of the Taber test on the same are also shown in Table 2. The multilayer coatings of Comparative Examples 1–6 were subjected to the acid and alkali tests described hereinbefore. By these tests, each coating exhibited little deterioration.

With reference to FIGS. 1–5, a method for forming a thin film band on each of a plurality of transparent glass plates by means of jigs in accordance with a first embodiment of the present invention will be described in the following.

The thin film band 10 is of a functional film for various purposes, such as a film which is substantially high or low in transmittance for radio waves, a heat insulating film, and the like. The thin film band 10 may have various colors. However, it is preferable that the thin film band 10 has a gray color. The gray-colored thin film band 10 is particularly suitable for a shade band of an automobile. The thin film band 10 has a certain optical characteristics, and is superior in wear resistance, chemical resistance, and the like.

The first, second, third and fourth jigs 12, 14, 16 and 18 are specially designed for forming the thin film band 10 on each of the first, second and third transparent glass plates 20, 22 and 24. Each jig 12, 14, 16 or 18 is made of fluororubber, fluororesin, a metal such as stainless steel or aluminum, or the like. It is necessary that each jig is heat resistant and corrosion resistant. As is seen from FIG. 1, each jig is formed at its left end portion with a projection portion 12a, 14a, 16a or 18a. As is seen from FIG. 2, the projection portion (for example, 14a) has a length "m", and a height "h". As is seen from FIG. 3, the first jig 12 has at its upper surface a heat resistant cushioning member 12b on which the first glass plate 20 is to be placed and positioned relative to the first jig 12, a masking member 12c for masking a major part of the first glass plate 20 during the sputtering process, and leg portions 12d having adjusting portions 12e for adjusting the height "h" of the projection portion 12a and fixing portions 12f having elongate holes 12g for adjusting the length "m" of the projection portion 12a. The second, third and fourth jigs 14, 16 and 18 are similar to the first jig 12 in construction.

Each glass plate is not necessarily an inorganic glass plate and may be a so-called organic or plastic glass plate. The glass plate with the thin film band 10 can be used as a front, rear, side or door windshield of an automobile.

Figure 1:
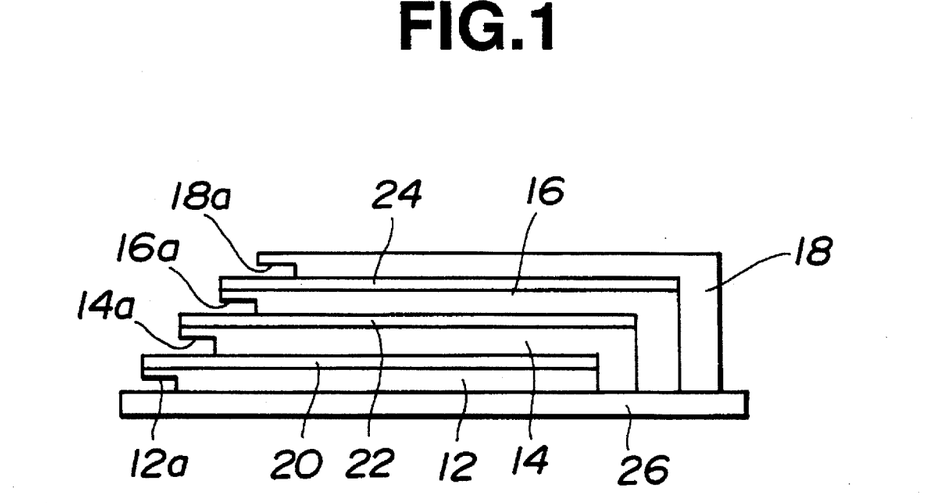
FIG. 1 is a side view showing glass plates which are positioned relative to each other by means of jigs in accordance with a first embodiment of the present invention.

As is seen from FIG. 1, the glass plates 20, 22 and 24 are positioned relative to each other by the jigs 12, 14, 16 and 18 such that a left end upper surface of each glass plate is exposed. The thus positioned glass plates together with the jigs are disposed in a vacuum chamber of a sputtering device such that major surfaces of the glass plates are opposed to a target of the sputtering device. Then, the target is sputtered. As the result, as is seen from FIG. 2, a thin film band 10 deposits on the left end upper surface of the glass plate (for example, 20). The thin film band 10 consists of first and second portions 10a and 10b, and has a length "L". The first portion 10a has a flat upper surface, a uniform thickness, and a length "L1". The thus shaped first portion 10a is formed because the target material deposits perpendicularly uniformly on the glass plate 20. The second portion 10b is wedgelike in shape, and has a length "L2". The thus shaped second portion 10b is formed because the target material deposits obliquely on the glass plate due to the provision of the projection potion 14a of the jig 14. The first portion 10a has, for example, a uniform gray color, and the second portion 10*b* is gradated in color due to its wedgelike shape. Therefore, it becomes difficult to recognize a boundary between the uncoated portion of the glass plate and the coated portion of the same by the naked eye. It is the main feature of the present invention that a thin film band having a gradated portion is formed on each of a plurality of glass plates at the same time by the sputtering method by means of a specifically designed jigs. Therefore, the productivity is substantially improved as compared with a conventional technique.

Figure 2:
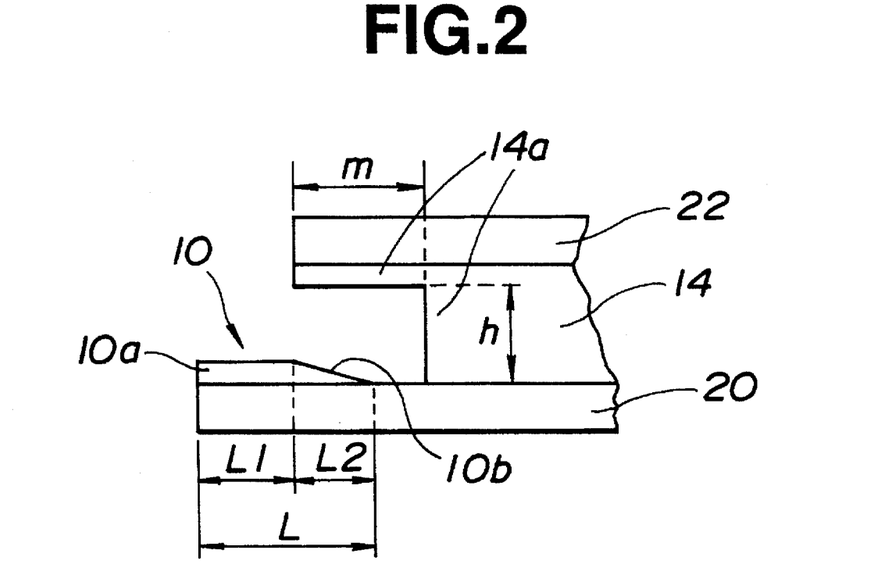
FIG. 2 is an enlarged side view showing a thin film band having a gradated portion, which is formed on a left end portion of the glass plate, in accordance with the first embodiment.
Figure 3:
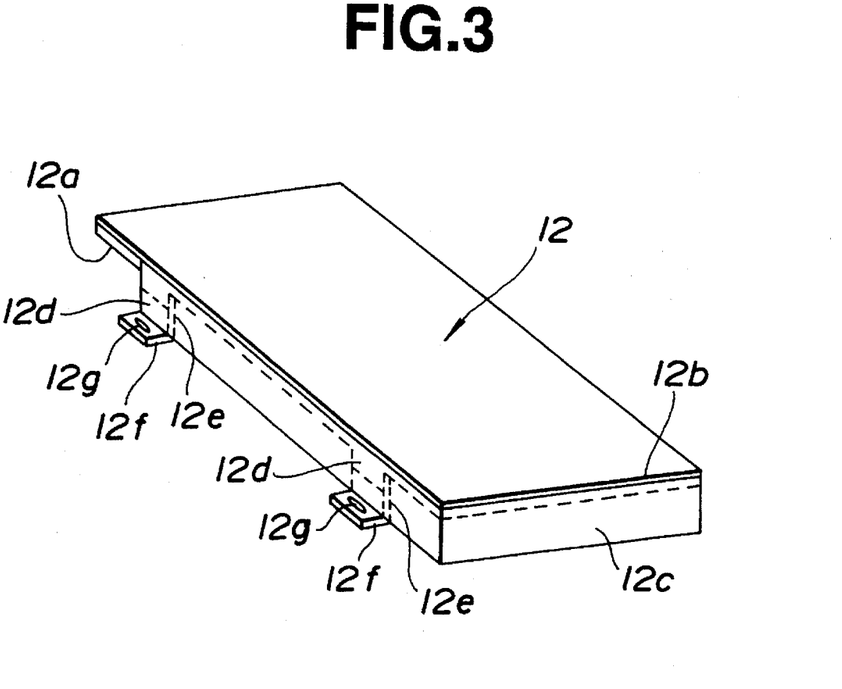
FIG. 3 is a perspective view of a first jig.
Figure 4:
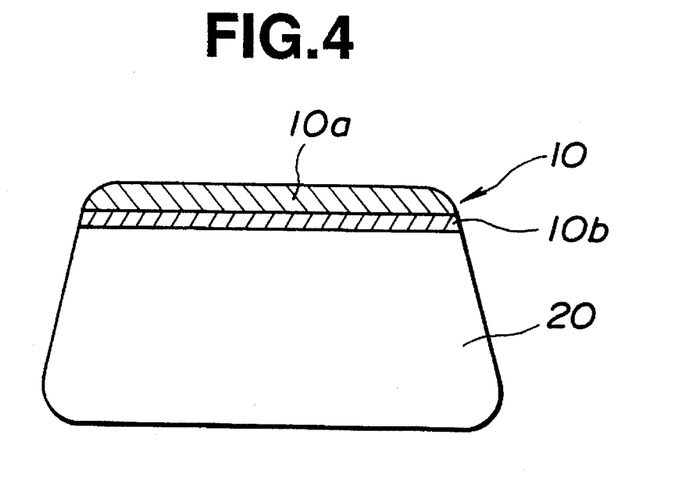
FIG. 4 is a plan view of an automobile rear windshield on which the thin film band is formed.

To use a coated glass plate according to the present invention for an automobile windshield, the length "L" of the thin film band 10 is preferably from about 100 to about 150 mm, the length "L2" of the second portion 10*b* is preferably from about 10 to about 75 mm, more preferably from about 15 to about 60 mm, still more preferably from about 20 to about 50 mm and the most preferably from about 30 to about 40 mm, and the height "h" of the projection portion of the jig is preferably from about 7 to about 50 mm, more preferably from about 15 to about 45 mm, still more preferably from about 20 to about 40 mm and the most preferably from about 25 to about 35 mm. When the length "L2" of the second portion 10*b* is less than about 5 mm, a linear boundary between the coated portion and the uncoated portion will appear. When the vertical distance between the uppermost and the lowermost glass plates 24 and 20 becomes too much, the glass plates will have the gradated (second) portions 10*b* which are different in color tone.

Figure 6:
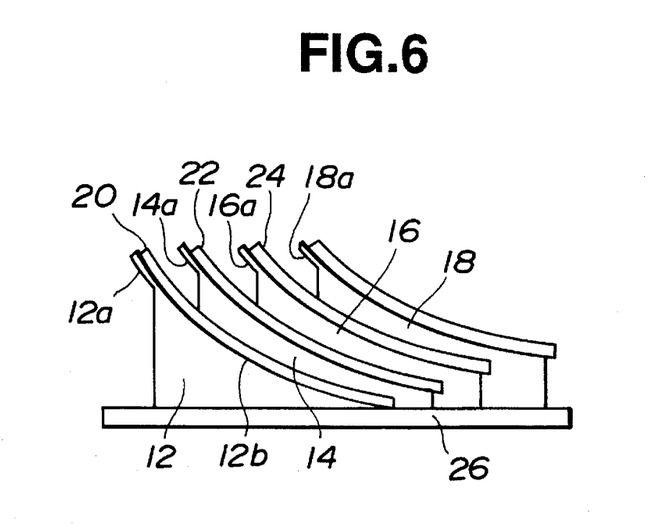
FIG. 6 is a view similar to FIG. 1, but showing a second embodiment of the present invention.

According to a second embodiment of the present invention, as is seen from FIG. 6, it is optional to obliquely dispose the glass plates 20, 22 and 24 for forming thin film bands thereon. In this case, the vertical distances between the sputtering target and the coating portions of the glass plates are substantially the same. Therefore, the gradated portions 10*b* will be substantially the same in color tone. The angle of the glass plates relative to a carrier 26 is preferably not greater than 45°, more preferably from about 5° to 40°, and still more preferably from about 10° to 30°.

In the present invention, it is optional to use other physical vapor deposition methods such as vacuum vapor deposition method.

The following nonlimitative examples are illustrative of the present invention.

EXAMPLE 6

First, second and third transparent glass plates 20, 22 and 24 each of which has a length of about 150 cm, a width of about 80 cm and a thickness of about 3.5 mm were prepared. Then, the length "m" and the height "h" of the projection portion 12*a*, 14*a*, 16*a* or 18*a* of each of the first, second, third and fourth jigs 12, 14, 16 and 18 were respectively adjusted to about 25 mm and about 12 mm. Then, the first jig 12 was placed on a carrier 26, and then the first glass plate 20 was placed and positioned relative to the first jig 12. Similarly, the second jig 14 was placed on the first glass plate 20, and then the second glass plate 22 was placed on the second jig 14. Further, the third jig 16 was placed on the second glass plate 22, and then the third glass plate 24 was placed on the third jig 16. Finally, the fourth jig 18 was placed on the third glass plate 24. The carrier 26 on which the glass plates and the jigs had been thus placed was installed in a vacuum chamber of an inline sputtering device such that the glass plates were below and opposed to a stainless steel (SUS 316) target. Then, the chamber was depressurized to the extent of about $5 \times 10^{-6}$ Torr. Then, a mixed gas of $N_2$ and $O_2$ in the flow rate ratio of 92:8 was introduced into the vacuum chamber to maintain the degree of vacuum at about $2 \times 10^{-3}$ Torr. Under such condition, the S US target was sputtered at a power of about 50 kW. As the result, a SUSNxOy film having a thickness of about 24 nm deposited on each glass plate as the first layer.

Then, the feed of the gas and the power supply to the SUS target were stopped, and a mixed gas of $O_2$ and Ar in the flow rate ratio of 95:5 was introduced into the vacuum chamber to maintain the degree of vacuum at about $2 \times 10^{-3}$ Torr. Under such condition, the carrier 26 was transferred to a region below a Ta target so as to oppose the glass plates to the Ta target, and the Ta target was sputtered at a power of about 50 kW. As the result, a Ta film having a thickness of about 5 nm deposited, as the second layer, on the first layer of each glass plate. Then, the feed of the gas and the power supply to the Ta target were stopped.

By the above process a two-layer thin film band 10*a* having a gradated portion 10*b* was formed on one side of each glass plate. The thin film band 10 was grayish in color. The length "L2" of the gradated portion 10*b* was about 16 mm.

EXAMPLES 7 and 8

As is seen from Table 3, Example 6 was modified in respect to the types of the glass plates, and the height "h" and the length "m" of the projection portion of each jig.

COMPARATIVE EXAMPLE 7

The processes of Example 6 were repeated except that the height "h" and the length "m" of the projection portion were respectively adjusted to 0 mm. The length "L2" of the gradated portion 10*b* was only 1 mm, and thus a linear boundary between the coated portion and the uncoated portion was clearly recognized by the naked eye.

COMPARATIVE EXAMPLE 8

Only one layer of TiNxOy was formed on each glass plate by the sputtering method. The height "h" and the length "m" of the projection portion were respectively adjusted to 2 mm and 5 mm. The length "L2" of the gradated portion 10*b* was only 2 mm, and thus a linear boundary between the coated portion and the uncoated portion was clearly recognized by the naked eye.

On the samples of the coated glass plates according to Examples 6–8 and Comparative Examples 7 and 8, the transmittance and reflectance for the visible light and transmittance and reflectance for solar radiation were measured. The results are shown in Table 4. Besides, wear resistance of the thin film band 10 was examined by a traverse test with 500 turns. By this test, all the samples of the thin film band 10 according to Examples 6–8 and Comparative Examples 7 and 8 showed satisfactory wear resistances. Further, acid and alkali resistances of the thin film band 10 were examined by immersing some specimens of the coated glass plate in 1N HCl solution at room temperature for about 6 hr and separate specimens in 1N NaOH solution at room temperature for about 6 hr. In both cases the degree of deterioration of the thin film band was examined by visual observation. On every specimen according to Examples 6–8 and Comparative Examples 7 and 8, deterioration of the thin film band 10 was hardly perceptible.

Figure 5:
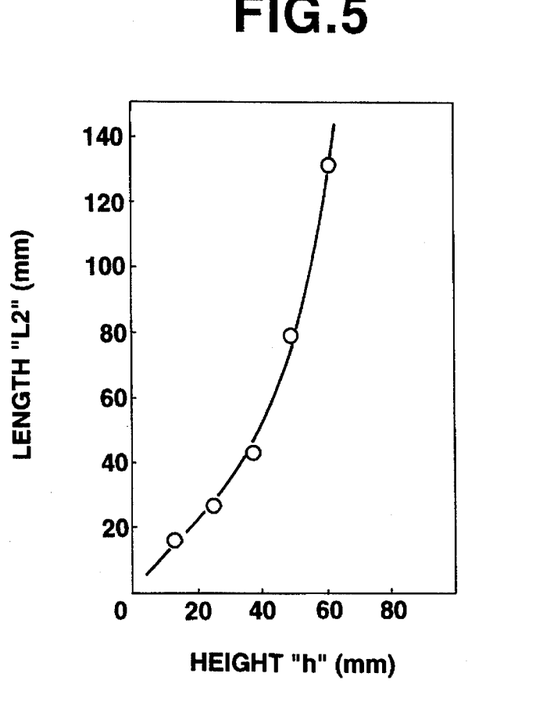
FIG. 5 is a graph showing a relationship between the height "h" of a projection portion of the jig and the length "L2" of the gradated portion.

FIG. 5 shows a relationship between the length "L2" of the gradated portion 10b and the height "h" of the projection portion. This relationship was obtained by real data. It is understood that the length "L2" is increased by increasing the height "h".

TABLE 1

|  | Glass Plate (thickness, mm) | Structure of Coating (thickness, nm) | | |
|---|---|---|---|---|
|  |  | 1st layer | 2nd layer | 3rd layer |
| Example 1 | NG (3.1) | TaOx (10) | SUSNOx (5) | TaOx (10) |
| Example 2 | FL (3.5) | TaOx (5) | SUSNOx (25) | TaOx (5) |
| Example 3 | NG (3.1) | TaOx (15) | SUSNOx (8) | TaOx (15) |
| Example 4 | NG (3.5) | TaOx (10) | SUSNOx (12) | TaOx (10) |
| Example 5 | FL (3) | TaOx (20) | SUSNOx (15) | TaOx (20) |
| Comp. Ex. 1 | FL (3.5) | TaOx (5) | SUS (10) | TaOx (5) |
| Comp. Ex. 2 | NG (3.5) | TaOx (10) | SUSNx (12) | TaOx (10) |
| Comp. Ex. 3 | NG (3.1) | TaOx (5) | SUSNx (10) | TaOx (5) |
| Comp. Ex. 4 | NG (3.1) | TaOx (10) | SUSNx (30) | TaOx (10) |
| Comp. Ex. 5 | FL (3) | TaOx (10) | CrNx (15) | TaOx (10) |
| Comp. Ex. 6 | NG (3.5) | TaOx (10) | SiC (20) | TaOx (10) |

TABLE 2

|  | Visible Light Transmittance (%) | Visible Light Reflectance (%) | | Solar Radiation Transmittance (%) | Color of Coated Glass | Surface Resistivity (Ω/□) | Taber Test ΔH (%) |
|---|---|---|---|---|---|---|---|
|  |  | uncoated side | coated side |  |  |  |  |
| Example 1 | 58.1 | 12.3 | 18.0 | 61.9 | gray | $2.5 \times 10^5$ | 2.4 |
| Example 2 | 26.7 | 17.7 | 28.4 | 28.9 | gray | $1.5 \times 10^3$ | 4.0 |
| Example 3 | 46.6 | 13.2 | 21.5 | 50.0 | gray | $5.5 \times 10^4$ | 2.1 |
| Example 4 | 37.8 | 12.1 | 21.8 | 42.3 | gray | $3.3 \times 10^4$ | 2.7 |
| Example 5 | 40.8 | 10.1 | 20.6 | 38.1 | gray | $8.5 \times 10^3$ | 3.1 |
| Comp. Ex. 1 | 28.3 | 21.0 | 29.2 | 27.3 | silver gray | 160 | 4.1 |
| Comp. Ex. 2 | 33.7 | 12.4 | 24.1 | 31.1 | gray | 250 | 2.6 |
| Comp. Ex. 3 | 40.5 | 8.5 | 21.1 | 38.0 | gray | 300 | 3.5 |
| Comp. Ex. 4 | 7.0 | 27.9 | 40.0 | 6.8 | silver gray | 70 | 5.0 |
| Comp. Ex. 5 | 32.1 | 16.8 | 30.4 | 25.7 | bronze gray | $7.0 \times 10^3$ | 5.3 |
| Comp. Ex. 6 | 36.1 | 29.7 | 42.7 | 48.2 | bronze | $1.0 \times 10^8$ | 1.6 |

TABLE 3

|  | Glass Plate (thickness, mm) | Structure of film (thickness, nm) | | Height "h" (mm) | Length "m" (mm) | Length "L2" (mm) |
|---|---|---|---|---|---|---|
|  |  | 1st layer | 2nd layer |  |  |  |
| Example 6 | FL (3.5) | SUSNxOy (24) | TaOx (5) | 12 | 25 | 16 |
| Example 7 | NFL (3.5) | SUSNxOy (24) | TaOx (5) | 24 | 40 | 28 |
| Example 8 | NFL (3.5) | SUSNxOy (10) | TaOx (5) | 38 | 70 | 42 |
| Comp. Ex. 7 | FL (3.5) | SUSNxOy (24) | TaOx (5) | 0 | 0 | 1 |
| Comp. Ex. 8 | FL (3.5) | TiNxOy (50) | — | 2 | 5 | 2 |

TABLE 4

|  | Visible Light Transmittance (%) | Visible Light Reflection (%) | | Solar Radiation Transmittance (%) | Solar Radiation Reflectance (%) | | Color of Coated Glass |
| --- | --- | --- | --- | --- | --- | --- | --- |
|  |  | uncoated side | coated side |  | uncoated side | coated side |  |
| Example 6 | 33.2 | 28.5 | 20.4 | 36.6 | 26.3 | 16.4 | gray |
| Example 7 | 29.5 | 34.3 | 16.5 | 31.4 | 30.4 | 13.5 | gray |
| Example 8 | 44.6 | 19.9 | 9.2 | 45.2 | 19.9 | 9.2 | gray |
| Comp. Ex. 7 | 33.2 | 28.5 | 20.4 | 36.6 | 26.3 | 16.4 | gray |
| Comp. Ex. 8 | 39.3 | 31.0 | 27.8 | 31.6 | 31.0 | 22.0 | bronze |

What is claimed is:

1. A method for forming thin film bands on first and second transparent glass plates by means of first and second jigs, each of the first and second jigs being corrosion resistant, heat resistant and formed with a projection portion, the method comprising the steps of:

(a) placing the first glass plate on a base member such that a first major surface of the first glass plate is exposed, the first major surface having a first end portion and a first adjacent portion which bounds on the first end portion;

(b) placing the first jig on the first glass plate so as to precisely position the first jig relative to the first glass plate such that a major portion of the first major surface is masked by the first jig, such that the first end portion of the first glass plate remains exposed and such that the projection portion of the first jig is positioned spaced from and above the first adjacent portion;

(c) placing the second glass on the first jig so as to precisely position the second glass plate relative to the first jig such that a second major surface of the second glass plate is exposed, the second major surface having a second end portion and a second adjacent portion which bounds on the second end portion, and such that the first end portion of the first glass plate still remains exposed, (d) placing the second jig on the second glass plate so as to precisely position the second jig relative to the second glass plate and to form a structure having the first and second glass plates and the first and second jigs such that a major portion of the second major surface is masked by the second jig, such that the first and second end portions remain exposed and such that the projection portion of the second jig is positioned spaced from and above the second adjacent portion;

(e) placing the structure in a physical vapor deposition device such that the first and second end portions are exposed to a target of the device; and (f) actuating the device such that a first thin film portion deposits on each of the first and second end portions and a second thin film portion deposits on each of the first and second adjacent portions, the first and second thin film portions being merged with each other so as to form the thin film band, the first thin film portion being uniform in thickness and color, the second thin film portion being wedge shaped and thus gradated in color.

2. A method according to claim 1, wherein the physical vapor deposition device is a sputtering device.

3. A method according to claim 1, wherein each of the first and second glass plates is an automobile front windshield, rear windshield, side windshield or door windshield.

4. A method according to claim 1, wherein each thin film band is a multilayer coating comprising:

a first formed on a surface of the glass plate, said first layer being a film of a tantalum oxide and having a thickness ranging from 5 to 20 nm;

a second layer formed on said first layer, said second layer being a film of an oxynitride of a metal selected for Cr, Ni—Cr alloy and stainless steel and having a thickness ranging from 5 to 25 nm; and a third layer formed on said second layer, said third layer being a film of a tantalum oxide and having a thickness ranging from 5 to 20 nm.

5. A method according to claim 4, wherein the multilayer coating is formed such that a portion of each of the first and second glass plates which has been coated with the multilayered coating has a transmittance ranging from 10 to 60% for visible light.

6. A method according to claim 4, wherein the multilayer coating has surface resistivity not lower than 1 k$\Omega$/□.

7. A method according to claim 4 wherein said first layer has a thickness ranging from 5 to 15 nm.

8. A method according to claim 7, wherein said first layer has a thickness ranging from 5 to 10 nm.

9. A method according to claim 4, wherein said second layer has a thickness ranging from 6 to 23 nm.

10. A method according to claim 9, wherein said second layer has a thickness ranging from 8 to 20 nm.

11. A method according to claim 4, wherein said third layer has a thickness ranging from 5 to 15 nm.

12. A method according to claim 11, wherein said third layer has a thickness ranging from 5 to 10 nm.

13. A method according to claim 5, wherein the portion has a transmittance ranging from about 20 to about 55% for the visible light.

14. A method according to claim 13, wherein the portion has a transmittance ranging from about 30 to about 50% for the visible light.

15. A method according to claim 4, wherein the multilayer coating is formed by a sputtering process.

16. A method according to claim 1, wherein each of the first and second jigs is sized so as to respectively mask the major portion of the first and second major surfaces when each of the first and second jigs is respectively placed on the first and second glass plates, and wherein each jig comprises:

a projection portion which is to be positioned above each of the first and second adjacent portions when each jig is placed on each of the first and second glass plates;

means for adjusting a height of the projection portion, the height being defined as a distance between the projection portion and each of the first and second glass plates when each jig is placed on each of the first and second glass plates.

17. A method according to claim 16, wherein the first major surface of the first glass plate and the second major surface of the second glass plate are flat in shape, and each of the first and second jigs has a major surface which is flat in shape, such that the major surface of the first jig is intimately put on the first major surface of the first glass plate and that the major surface of the second jig is intimately put on the second major surface of the second glass plate.

18. A method according to claim 16, wherein the first major surface of the first glass plate and the second major surface of the second glass plate are curved in shape, and each of the first and second jigs has a major surface which is curved in shape, such that the major surface of the first jig is intimately put on the first major surface of the first glass plate and that the major surface of the second jig is intimately put on the second major surface of the second glass plate.

* * * * *

UNITED STATES PATENT AND TRADEMARK OFFICE
CERTIFICATE OF CORRECTION

PATENT NO. : 5,501,780
DATED : March 26, 1996
INVENTOR(S) : IIDA et al

It is certified that error appears in the above-indentified patent and that said Letters Patent is hereby corrected as shown below:

Please correct the title page, as follows:

(75) Inventors: change "Yasunchu Iida" to -- Yasunobu Iida --

Signed and Sealed this

Nineteenth Day of November, 1996

Attest:

BRUCE LEHMAN

*Attesting Officer*     *Commissioner of Patents and Trademarks*